(12) United States Patent
Myer

(10) Patent No.: US 6,359,507 B1
(45) Date of Patent: Mar. 19, 2002

(54) METHOD AND APPARATUS FOR AN AUTOMATIC PREDISTORTION SYSTEM

(75) Inventor: Robert Evan Myer, Denville, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/375,749

(22) Filed: Aug. 18, 1999

(51) Int. Cl.[7] ............................. H03F 1/26; H04K 1/02
(52) U.S. Cl. .................... 330/149; 375/296; 330/151
(58) Field of Search ........................ 330/149, 151; 375/296, 297

(56) References Cited

U.S. PATENT DOCUMENTS

| | | | | |
|---|---|---|---|---|
| 4,879,519 A | * | 11/1989 | Myer | 330/149 |
| 5,570,063 A | * | 10/1996 | Eisenberg | 330/149 |
| 5,770,971 A | * | 6/1998 | McNicol | 330/151 |
| 5,892,397 A | * | 4/1999 | Belcher et al. | 330/149 |
| 5,900,778 A | * | 5/1999 | Stonick et al. | 330/149 |
| 5,923,215 A | * | 7/1999 | Hans | 330/149 |
| 5,963,090 A | * | 10/1999 | Fukuchi | 330/149 |
| 5,990,734 A | * | 11/1999 | Wright et al. | 330/149 |

* cited by examiner

*Primary Examiner*—Benny Lee
*Assistant Examiner*—Khanh Van Nguyen
(74) *Attorney, Agent, or Firm*—Claude R. Narcisse

(57) ABSTRACT

Method and apparatus for substantially eliminating distortion produced by a processing circuit where the distortion produced by a first circuit with similar characteristics as the processing circuit is modified and the modified distortion is applied to the processing circuit. The distortion produced by the first circuit is modified based on information derived from distortion produced by the processing circuit. The modified distortion, when applied to the processing circuit, combines destructively with distortion produced by the processing circuit.

18 Claims, 2 Drawing Sheets

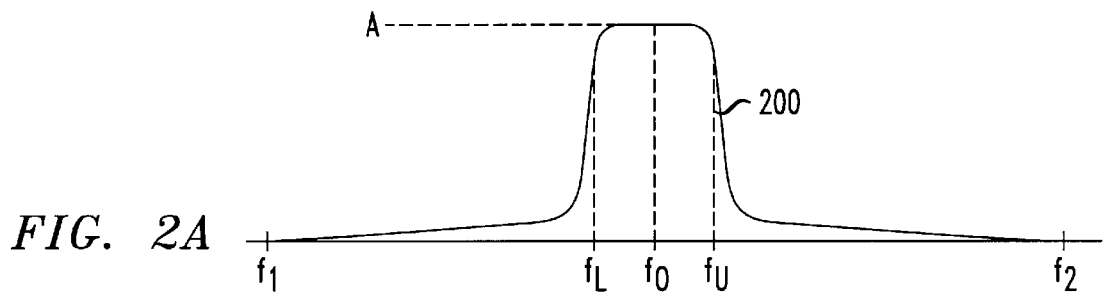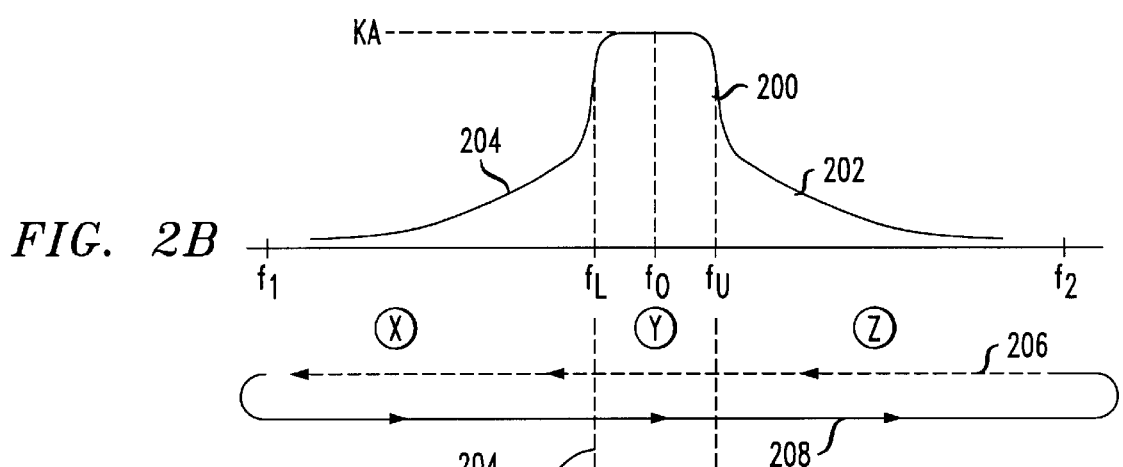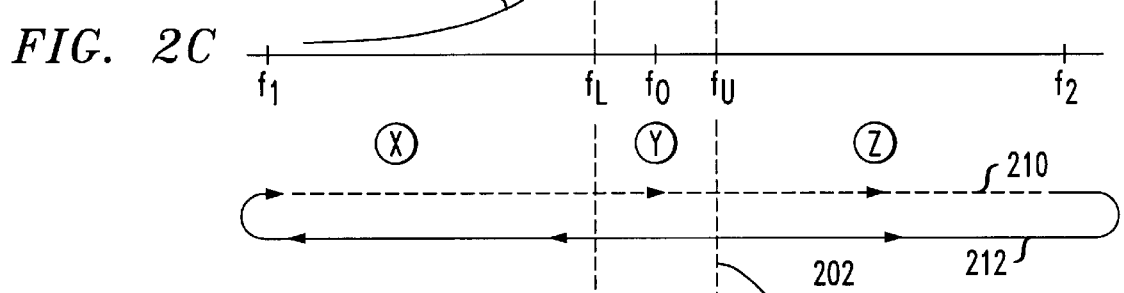

METHOD AND APPARATUS FOR AN AUTOMATIC PREDISTORTION SYSTEM

BACKGROUND OF THE INVENTION

1. Field of the Invention

The present invention is generally related to predistortion systems and in particular to an automatic predistortion system for a processing circuit.

2. Description of the Related Art

Signals, when are applied to circuits (e.g., electrical, optical), are often distorted as a result of being processed by the circuits. The distortion comprises any undesired signals produced by these processing circuits which are added to or are somehow combined with the applied signals. A well known technique for substantially canceling distortion produced by a processing circuit is a feedforward control system which has at least two feedforward loops coupled to the processing circuit to substantially reduce distortion produced by the processing circuit. The main problem with this technique is that each particular processing circuit requires its own separate set of feedforward control loops and thus the complexity of the control system significantly increases for applications requiring a plurality of processing circuits. Furthermore, the feedforward systems often need associated circuitry for each of the feedforward loops which circuitry provides control signals and information to the feedforward loops for reducing the distortion produced by the processing circuit; this further increases the complexity of the control system. Also, the associated circuitry often makes use of pilot signals applied to the processing circuit and the information is derived from the processed pilot signal. The pilot signal often interferes with signals applied to the processing circuit and thus still more circuitry is needed to control the generation and proper application of the pilot signal.

What is therefore needed is a system which is of relatively low complexity and is able to substantially reduce distortion produced by one or a plurality of processing circuits.

SUMMARY OF THE INVENTION

The present invention provides a method and apparatus for substantially reducing distortion produced by at least one processing circuit. The present invention is configured as an automatic predistortion system which comprises a first circuit configured to have substantially the same physical characteristics as the at least one processing circuit. Distortion produced by this first circuit, which is therefore very similar to the distortion produced by the at least one processing circuit, is isolated by a first feedforward loop coupled to the first circuit. A second feedforward loop coupled to the first feedforward loop, the first circuit and the at least one processing circuit is used to modify the isolated distortion. A scanning circuit coupled to the first circuit, the feedforward loops and the at least one processing circuit is configured to obtain information that is used to modify the isolated distortion. The information is obtained from a side band of signals applied to the automatic predistortion system and appearing at the output of the predistortion system such that when the modified isolated distortion is applied to the at least one processing circuit, the modified isolated distortion combines destructively with the distortion produced by the at least one processing circuit thus substantially reducing the distortion produced by the at least one processing circuit.

BRIEF DESCRIPTION OF THE DRAWINGS

FIG. 2A depicts the spectrum of a signal applied to the automatic predistortion system of the present invention;

FIG. 2B depicts the spectrum of the applied signal at the output of the predistortion system of the present invention;

FIG. 2C depicts the left side band of the spectrum of FIG. 2B, the scanning path and the return path of the scanning circuit;

FIG. 2D depicts the right side band of the spectrum of FIG. 2B, the scanning path and the return path of the scanning circuit.

DETAILED DESCRIPTION

Figure 1:
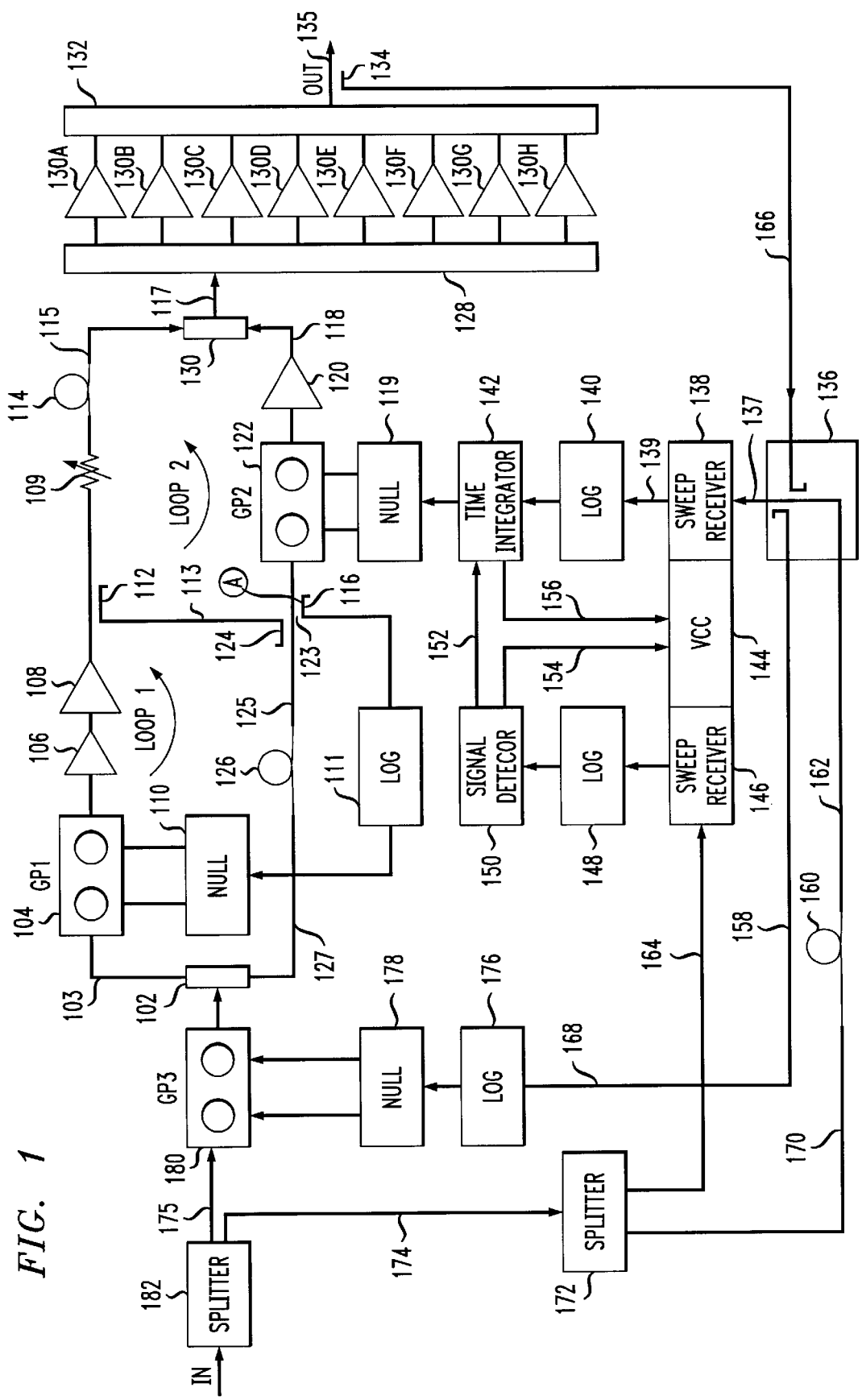
FIG. 1 shows the automatic predistortion system of the present invention.

Referring to FIG. 1, there is shown an automatic predistortion system of the present invention. Processing circuits 130A–130H are shown as amplifiers coupled in parallel. It will be readily understood that the processing circuits and all other circuits described herein can be any type of circuit (coupled in any manner) from any one or a combination of various technologies (e.g., electrical, electronic, optical). For ease of discussion, processing circuits 130A–130H are Radio Frequency (RF) electrical amplifiers used for example in communication systems such as wireless communication systems. Also, for ease of discussion, First circuit 108 is also an RF amplifier circuit. The distortion produced by First circuit 108 is isolated at point A by loop 1. The isolated distortion is applied to loop 2 which modifies such isolated distortion based on information retrieved from a side band of a signal applied to the processing circuits. When the modified isolated distortion is applied to the parallel coupled processing circuits (130A–130H) it combines destructively with distortion produced by the processing circuits thus substantially reducing the distortion produced by these processing circuits.

First circuit 108 has the same physical characteristics as each of the processing circuits 130A–130H; that is First circuit 108 is built with components that are substantially identical in terms of operation and physical makeup to the components used to design the processing circuits. For example, for semiconductor circuit fabrication, First circuit 108 and processing circuits 130A–130H are built from the same semiconductor slab material. Because of the nearly identical physical and operational characteristics of these circuits, they will produce distortion signals that are very similar.

Loop 1 isolates the distortion produced by First circuit 108 in the following manner: A signal applied to splitter 102 is replicated on paths 103 and 127. Splitter 102 is part of a feed forward loop referred to as Loop 1, which in addition to splitter 102, comprises Gain/Phase circuit 104, amplifier 106, First circuit 108, coupler 124, coupler 112 and delay circuit 126. Gain/Phase circuit 104 is any well known circuit having at least one input, control inputs and at least one output which circuit modifies the amplitude and phase of a signal applied to its input based on control signals applied to control inputs of the Gain/Phase circuit. Couplers 112 and 124 are any well known circuit having at least one input and at least one output where the output is at least a portion of the algebraic combination of signals applied to the at least one input. Delay circuit 126 is any well known circuit with at least one input and at least one output where signals applied to the at least one input appear at the at least one output delayed by a certain amount of time.

The input signal on path 103 is applied to Gain/Phase circuit 104. The output of Gain/Phase circuit 104 is applied to amplifier 106 whose output is applied to First circuit 108. A portion of the output of First circuit 108 (comprising distortion produced by First circuit 108 and the applied signal) is obtained from coupler 112 and is combined with a delayed version of the input signal (signal on path 125) at coupler 124. The input signal (to coupler 124) on path 127 is delayed by delay circuit 126 such that input signal on path 125 has experienced substantially the same delay as the input signal on path 113. A portion of the output of coupler 124 is obtained via coupler 116 and provided to Log amplifier 111. Log amplifier 111 is any well known circuit that provides an average of the amplitude of a signal. The output of Log amplifier 111 is applied to Null circuit 110 which generates control signals for Gain Phase circuit 104. Null circuit 110 is any well known circuit which converts characteristics of a signal (i.e., amplitude and phase) to control signals which control signals are applied to Gain Phase circuit 104. The control signals generated by Null circuit 110 cause Gain/Phase circuit 104 to modify the applied input signal such that the input signal appearing on path 113 is substantially the inverse (substantially equal amplitude but 180°+/−1° out of phase) of the input signal appearing on path 125. When the two input signals are combined by coupler 124, they substantially cancel each other leaving any distortion signals produced by First circuit 108 at point A. Thus, Loop 1 serves to isolate distortion produced by First circuit 108 at point A. The isolated distortion at point A is modified by Gain/Phase circuit 122 and amplifier 120 such that the distortion appearing on path 117 combines destructively with distortion produced by the processing circuits. Gain/Phase circuit 122 and amplifier 120 modifies the isolated distortion based on information from signals applied to the automatic predistortion system of the present invention.

A signal applied to the automatic predistortion system for processing by processing circuits 130A–130H has a certain bandwidth. The bandwidth of the signal is defined as a frequency range within which frequency components of the signal are located. Referring to FIG. 2A, there is shown a frequency response (200) or spectrum of the input signal (i.e., input to splitter 182) to the automatic predistortion system of the present invention. From FIG. 2A the bandwidth is the range of frequencies between a lower frequency $f_L$ and an upper frequency $f_U$ within which frequency components of the signal have an amplitude A; $f_0$ is known as the center frequency. Therefore, the bandwidth of the signal is $f_U-f_L$. The signal after having been processed by the parallel coupled amplifiers now has a spectrum depicted by FIG. 2B.

In FIG. 2B, the spectrum of the signal at the output of the predistortion system (now amplified by a factor k) has three portions, i.e., the signal spectrum 200 and side bands 204 and 202. Each side band is a spectrum located outside the bandwidth of the applied signal. It is well known that the side bands are manifestations of the distortion produced by the processing circuits as such distortion was not present in the original signal shown in FIG. 2A. Information about the distortion produced by the processing circuits can therefore be obtained from the side bands. Furthermore, it is well known that the distortion is symmetrical; that is, side band 204 has the same distortion information as side band 202.

Referring back to FIG. 1, the output signal of the parallel coupled processing circuits 130A–130H appears on path 135 and has a spectrum depicted by FIG. 2B. It should be noted that a larger bandwidth bounded by frequencies $f_1$ and $f_2$ represents the bandwidth of the processing circuits (130A–130H) and the bandwidth of First circuit 108. The automatic predistortion system of the present invention further comprises a scanning circuit that is used to obtain information about the distortion produced by the processing circuit. The components of the scanning circuit and their interrelationships are discussed infra. The operation of the scanning circuit is best described with reference to FIGS. 2C and 2D.

Referring now to FIG. 2C, the scanning circuit scans a frequency range bounded by frequencies $f_1$ and $f_2$. The frequency range $f_1-f_2$ has three regions, viz., region x, region y and region z. Region x is bounded by frequencies $f_1$ and $f_L$; region y is bounded by frequencies $f_L$ and $f_U$; region z is bounded by frequencies $f_U$ and $f_2$. The scanning circuit scans the three regions in the manner shown by path 208. In particular, the scanning circuit starts at $f_1$ and scans to the right passing through regions x, region y and finally region z as shown by path 208. When the scanning circuit reaches frequency $f_2$, it resets to $f_1$ to scan the three regions in the same order again. Return path 206 is shown in broken line indicating that the scanning circuits resets itself to $f_1$ after it has scanned the three regions. The scanning circuit scans in the manner described above until a signal is applied to the predistortion system.

When a signal having a bandwidth $f_U-f_L$ is applied to the predistortion system, the scanning circuit detects the presence of the signal and then scans backward (reversing direction) for a fixed amount of time and takes an average (with the use of Timer Integrator 142) of the signals received by Sweep receiver 138. The scanning circuit then scans forward to $f_L$ and, if the applied signal is still present, the scanning circuit scans back from $f_L$ for a fixed amount of time thus scanning a portion of or the entire side band 204. The amount of side band 204 that is scanned depends on the sweep rate. Scanning side band 204 allows the scanning circuit to obtrain distortion information. Referring now to FIG. 2D, the scanning circuit can also be designed to scan from right to left starting at frequency $f_2$ and passing through regions z, then region y and finally region x as shown by scanning path 212. Return path 210 is shown in broken line indicating that the scanning circuit resets itself to $f_2$ after it has scanned the three regions. When a signal is applied to the automatic predistortion system, the scanning circuit detects the presence of the signal and then scans forward (reversing direction) for a fixed amount of time taking an average of the signals received by Sweep receiver 138 with Timer Integrator 142. The scanning circuit then scans backward to $f_U$ and, if the applied signal is still present, the scanning circuit scans forward for a fixed amount of time thus scanning a portion of or the entire side band 202. The amount of side band 202 that is scanned depends on the sweep rate. Scanning side band 202 allows the scanning circuit to obtain distortion information. It should be noted that because the side bands (202 and 204) are symmetrical and contain the same distortion information, the scanning circuit need only scan one of the side bands in order to obtain the distortion information.

Referring back to FIG. 1, the scanning circuit comprises Voltage Controlled Oscillator (VCO) 144 coupled to sweep receivers 146 and 138. The scanning circuit further comprises Log amplifiers 148, 140, Signal Detector 150 and Timer Integrator 142. VCO 144 is of the standard variety voltage controlled oscillator whose frequency of oscillation is proportional to an applied varied voltage. Typically a ramp signal generator (not shown) is applied to a VCO causing such circuit to output a range of frequencies in a continuous manner and return to its starting frequency when it reaches a certain end frequency. The sweep receivers are typical filters whose center frequencies can be varied based on the output of an oscillator circuit. The bandwidth of the sweep receivers throughout the entire frequency sweep range (i.e., $f_1$ to $f_2$) is preferably 6 kHz. The sweep time is preferably in the range of 1 msec. to 10 msec. Thus, the scanning circuit has a 6 kHz window that scans from $f_1$ to $f_2$ at a particular sweep rate. The sweep rate (typically measured in Hz/sec.) is defined as the ratio of the range of frequencies scanned to the amount of time it takes to scan such frequency range. Sweep receiver 146 sweeps the input of the predistortion system (i.e., input of splitter 182) and sweep receiver 138 sweeps the output of the predistortion system (i.e., path 135).

For the sake of discussion only, the scanning circuit is assumed to be designed to scan region x for retrieving information about distortion produced by the processing circuits (130A–130H) when a signal is applied to the input of the automatic predistortion system of the present invention. The scanning circuit starts to scan at frequency $f_1$ along path 208 as shown in FIG. 2C. Referring again to FIG. 1, the scanning operation involves VCO 144 oscillating at frequency $f_1$ which frequency of oscillation is increased in a continuous fashion and at a particular sweep rate. Sweep receivers 146 and 138 are coupled to VCO 144 such that they are tuned at the oscillating frequency of VCO 144. Thus, the rate at which VCO 144 increases its oscillating frequency (starting at frequency $f_1$) is the rate at which sweep receivers 146 and 138 sweep (or scan) the input and the output respectively of the automatic predistortion system of the present invention.

As the sweep receivers sweep across the frequency regions, they receive signals present in the frequency regions being swept. For sweep receiver 146, signals detected at the input of the predistortion system of the present invention are applied to Log amplifier 148. For sweep receiver 138, signals detected at the output of the predistortion system of the present invention are applied to Log amplifier 140. The output of Log amplifier 148 is applied to Signal detector 150 which generates an 'energy detected' signal (e.g., pulse, voltage) to indicate that its input signal is above a certain threshold. The threshold is set such that when a signal of a certain level or amplitude is present at the input of the predistortion system, the signal is received by sweep receiver 146, processed by Log amplifier 148 and detected by Signal detector 150 which sends an 'energy detected' signal (via path 152) to Timer Integrator 142.

Signal detector 150 also sends another 'energy detected' signal (which may or may not be in the same format as the signal on path 152) to VCO 144 via path 154 causing the VCO oscillating frequency to start sweeping in a reverse direction for a fixed amount of time. Upon reception of the 'energy detected' signal from Signal detector 150, Timer Integrator 142 generates a 'sweep rate/range' signal via path 156 to VCO 144. The sweep rate/range signal causes VCO 144 (and thus sweep filter 138) to sweep or scan region x or a portion thereof at a certain sweep rate. At this point sweep receiver 138 is receiving signals present at the output (i.e., path 135) of the predistortion system of the present invention. The received signals are applied to Log amplifier 140 whose output is applied to Timer Integrator 142. Timer integrator 142 is an averaging circuit which is implemented in any well known manner; that is Timer integrator 142 takes the average (e.g., statistical average, weighted average, arithmetic average) of the characteristics (e.g., amplitude, phase) of its input. The output of Timer integrator 142 is applied to Null circuit 119.

Null circuit 119 is any well known circuit which converts the characteristics of a signal applied to its input to control signals which are applied to Gain Phase circuit 122. Gain Phase circuit 122 is configured to modify the gain and/or phase of a signal appearing at its input. Thus, the isolated distortion signal at point A is modified as per the control signals generated by Null circuit 119.

Null circuit 119 is configured to generate control signals such that the distortion at point A is modified so that after it has been processed by Gain Phase circuit 122, amplifier 120 and combined (with combiner 130) with the signal appearing on path 115, the resulting distortion signal on path 117 is substantially the inverse (i.e., substantially equal in amplitude but 180°+/−1° out of phase) of the distortion produced by the parallel coupled processing circuits 130A–130H (via combiner 130 and splitter 128). Therefore, when the modified isolated distortion is applied to the parallel coupled processing circuits 130A–130H, it destructively combines with the distortion produced by such processing circuits so that the processing circuit distortion appearing on path 135 is substantially reduced.

Because the distortion produced by the parallel coupled processing circuits is not totally eliminated, the signal appearing on path 135 contains some residual processing circuit distortion. A portion of the signal appearing on path 135 (i.e., the output signal of the predistortion system comprising residual processing circuit distortion and input signal) is coupled to difference circuit 136 via path 166. Note that the signal appearing on path 162 is a replica of the input signal (via splitter 182, path 174, splitter 172 and path 170) delayed by delay circuit 160. The delay provided by delay circuit 160 is such that the delay experienced by the input signal after it has propagated through splitter 182, Gain Phase circuit 180, Loop 1, Loop 2, splitter 128, parallel coupled processing circuits 130A–130H, combiner 132, coupler 134, path 166 is substantially equal to the delay experienced by the input signal through splitter 182, path 174, splitter 172, path 170 and path 162. Note that combiners 130 and 132 are any well known circuit where a signal appearing at its output is a combination (e.g., algebraic sum) of signal s applied to its inputs.

Difference circuit 136 generates the difference (i.e., the algebraic difference) be tween the signal on path 166 (input signal +residual distortion) and the signal on path 162 (input signal). The resulting difference signal is applied to Sweep receiver 138 via path 137 and also appears on path 158. Stated in algebraic terms: (input signal on path 166+residual distortion)−(input signal on path 162)=residual distortion when it is assumed that the input signals on paths 166 and 162 are equal in amplitude and phase. In actual circuits there is also a residual input signal on paths 137 and 158. The residual input signal on path 137 is filtered out by Sweep receiver 138 since that receiver is scanning region x, which is outside the frequency band of the applied input signal. The residual distortion on path 137 is detected by sweep receiver 138 and applied Log amplifier 140, Timer Integrator 142 and Null circuit 169 which generates control signals to reduce the residual distortion.

The signal on path 158 (i.e., residual distortion and residual input signal) is applied to Log amplifier 176, Null circuit 178 and Gain Phase circuit 180. Note that because the residual distortion appearing on path 158 is relatively much less in amplitude than the residual input signal, Log amplifier 176 will virtually detect only the residual input signal. The residual input signal represents the difference between the input signal prior to application to the processing circuits and the input signal after processing by the processing circuits. Control signals generated by Null circuit 178 are such that Gain Phase circuit 180 adjusts the amplitud0 and phase of the input sign al applied via path 175 such that the amplitude of the signal applied to splitter 102 remains relatively constant. Thus, path 166 to path 158 (via difference circuit 136) to Log amplifier 176 to Null circuit 178 represent an Automatic Gain Control (AGC) circuit. The AGC circuit attempts to maintain the amplitude of the output signal (on path 135) relatively constant by adjusting the amplitude of the signal applied to Loop 1.

An attenuator 109 (e.g., variable resistor) is provided at the output side of First circuit 108 such that the input signal applied to the parallel coupled circuits 130A–130H can be reduced. When attenuator 109 is operated to reduce the input signal on path 117, the AGC circuit of the predistortion system of the present invention, in order to maintain lo the amplitude of the output signal (on path 135) at a constant level, will further amplify the applied input signal via Gain Phase circuit 180 resulting in First circuit 108 processing a signal with a relatively higher energy or power. Because of the relatively higher energy of the input signal being applied to First circuit 108, the distortion produced by First circuit 108 will be more closely related to or track closer to the distortion produced by the parallel coupled processing circuits 130A–130H. Therefore, because the respective distortions produced by First circuit 108 and processing circuits 130A–130H will be more closely related, such distortions can be used to virtually cancel each other as discussed above. Thus, attenuator 108 is used to further reduce the distortion produced by the processing circuits.

I claim:

1. An automatic predistortion system comprising:
    a first circuit;
    at least one processing circuit having at least one input and at least one output, the processing circuit being coupled to the first circuit; and
    a scanning circuit coupled the at least one processing circuit and the first circuit which scanning circuit comprises a first sweep receiver that scans signals applied to the system, a second sweep receiver that scans a side band of the applied signals at the at least one output of the at least one processing circuit and a voltage controlled oscillator coupled to the first and second sweep receivers where the second sweep receiver obtains information about distortion produced by the at least one processing circuit and uses that information to modify the distortion produced by the first circuit which modified distortion is applied to the at least one input of the at least one processing circuit so as to substantially reduce the distortion produced by the at least one processing circuit.

2. The automatic predistortion system of claim 1 where the first circuit is coupled to a first feedforward loop and a second feedforward loop which first feedforward loop is used to isolate the distortion produced by the first circuit and the second feedforward loop is used to modify the isolated distortion.

3. The automatic predistortion system of claim 2 where the second feedforward loop has circuitry for modifying phase and amplitude characteristics of the isolated distortion based on information provided by the scanning circuit which modified isolated distortion is transferred to the at least one input of the processing circuit.

4. The automatic predistortion system of claim 2 further comprising an AGC circuit coupled to the first feedforward loop and the at least one processing circuit.

5. The automatic predistortion system of claim 1 wherein the information comprises distortion produced by the at least one processing circuit.

6. The automatic predistortion system of claim 1 wherein an attenuator is coupled to an output of the first circuit which attenuator operation allows the distortion produced by the first circuit to more closely match the distortion produced by the processing circuit.

7. The automatic predistortion system of claim 1 wherein the first circuit and the processing circuit are configured such that they have substantially identical characteristics.

8. The automatic predistortion system of claim 1 where the first circuit and the at least one processing circuit are RF amplifiers.

9. The automatic predistortion system of claim 1 where the at least one processing circuit comprises a plurality of parallel coupled circuits.

10. The automatic predistortion system of claim 1 where the applied signals have a bandwidth and the second sweep receiver scans a range of frequencies spectrally located outside the bandwidth of the applied signals to obtain the information.

11. The automatic predistortion system of claim 1 where the scanning circuit further comprises:
    a signal detector circuit coupled to the first sweep receiver via a first log amplifier; and
    a timer integrator circuit coupled to the second sweep receiver via second log amplifier where the timer integrator and the signal detector are both coupled to the voltage controlled oscillator.

12. The automatic predistortion system of claim 1 where upon detection of the applied signal by the signal detector, the timer integrator generates a sweep rate/change signal causing the second sweep receiver to scan a side band of the signal applied to the automatic predistortion system.

13. The automatic predistortion system of claim 1 where the first sweep receiver has an output which output is applied to the signal detector thus allowing the signal detector to detect the applied signals.

14. The automatic predistortion system of claim 1 where each of the sweep receivers has a bandwidth of 6 KHz.

15. A method for substantially reducing distortion produced by a processing circuit that is part of a predistortion system, the method comprising the steps of:
    isolating distortion produced by a first circuit of the predistortion system which comprises a scanning circuit having a voltage controlled oscillator coupled to a first sweep receiver and a second sweep receiver where the scanning circuit and the first circuit am coupled to the processing circuit;
    modifying the isolated distortion based on information from the scanning circuit; and
    applying the modified isolated distortion to the processing circuit.

16. The method of claim 15 where the information on which the modifying step is based comprises distortion produced by the processing circuit.

17. The method of claim 15 where modifying the isolated distortion comprises:
    scanning, with the second sweep receiver, a spectrum within which the distortion produced by the processing circuit is located;
    obtaining distortion information from the scanned spectrum; and
    using the distortion information to modify the isolated distortion.

18. The method of claim 15 where the step of applying the modified isolated distortion to the processing circuit comprises destructively combining the modified isolated distortion with distortion produced by the processing circuit.

* * * * *

UNITED STATES PATENT AND TRADEMARK OFFICE
CERTIFICATE OF CORRECTION

PATENT NO. : 6,359,507 B1
DATED : March 19, 2002
INVENTOR(S) : Robert Evan Myer

It is certified that error appears in the above-identified patent and that said Letters Patent is hereby corrected as shown below:

Column 8,
Lines 26 and 31, "The automatic predistortion system of claim 1" should read -- The automatic predistortion system of claim 11 --.

Signed and Sealed this

Twenty-seventh Day of July, 2004

JON W. DUDAS
*Acting Director of the United States Patent and Trademark Office*